United States Patent [19]

Thoma et al.

[11] Patent Number: 5,801,953
[45] Date of Patent: Sep. 1, 1998

[54] MEASUREMENT APPARATUS AND METHOD FOR THE ADJUSTMENT OF TEST/MEASUREMENT PARAMETERS

[75] Inventors: Peter Thoma, Rottenberg; Alf Clement, Aidlingen; Juergen Sang, Gechingen; Peter Hoffmann, Boeblingen; Robert Jahn, Jettingen, all of Germany

[73] Assignee: Hewlett-Packard Company, Palo Alto, Calif.

[21] Appl. No.: 720,935

[22] Filed: Oct. 4, 1996

[30] Foreign Application Priority Data

Jun. 21, 1996 [EP] European Pat. Off. ............ 96110044

[51] Int. Cl.$^6$ .................................................. G01R 13/00
[52] U.S. Cl. ............... 364/487; 364/551.01; 364/709.12; 364/709.15; 324/121 R; 356/73.1; 345/145
[58] Field of Search ................... 364/487, 709.01, 364/709.12, 709.15, 550, 551.01; 345/168, 133, 134, 172, 145, 146, 339, 347; 324/553–535, 134, 131, 121 R; 356/73.1; 359/110, 177

[56] References Cited

U.S. PATENT DOCUMENTS

| | | | |
|---|---|---|---|
| 4,497,575 | 2/1985 | Phillipp | 356/73.1 |
| 5,129,722 | 7/1992 | Mader et al. | 356/73.1 |
| 5,134,377 | 7/1992 | Reddy, III et al. | 324/533 |
| 5,315,365 | 5/1994 | Hakimi et al. | 356/73.1 |
| 5,504,502 | 4/1996 | Arita et al. | 345/160 |
| 5,515,301 | 5/1996 | Corby, Jr. et al. | 364/578 |
| 5,517,105 | 5/1996 | Holzwarth | |
| 5,528,356 | 6/1996 | Harcourt | |
| 5,576,979 | 11/1996 | Lewis et al. | 364/578 |
| 5,592,606 | 1/1997 | Myers | 345/356 |
| 5,608,328 | 3/1997 | Sanderson | 324/529 |
| 5,654,816 | 8/1997 | Fishman | 359/177 |

FOREIGN PATENT DOCUMENTS

| | | |
|---|---|---|
| 0 278 163 | 8/1988 | European Pat. Off. |
| 0 376 515 | 7/1990 | European Pat. Off. |
| 0 416 731 | 3/1991 | European Pat. Off. |
| WO 95/12820 | 5/1995 | WIPO |

OTHER PUBLICATIONS

European Search Report, Application No. 96110044.3 dated Dec. 19, 1996, 4 pp.

Article entitled "Le Tekmeter THM 565 Tektronix", pp. 19–21 as appeared in Electronique Radio Plans (1994), No. 554, Paris, FR (translation not available).

*Primary Examiner*—Emanuel Todd Voeltz
*Assistant Examiner*—Cuong H. Nguyen

[57] ABSTRACT

An instrument is described for the measurement of optical and/or electrical signals, such as an optical time domain reflectometer (OTDR) or an electrical time domain reflectometer (TDR). The instrument includes a display to depict a waveform representative of measured signals, and can be operated by a few buttons, namely a start/stop button, a cursor-key and a select/confirmation-key. After adjustment of display parameters, almost the entire display is available for display of measured signals and data.

24 Claims, 7 Drawing Sheets

MEASUREMENT APPARATUS AND METHOD FOR THE ADJUSTMENT OF TEST/MEASUREMENT PARAMETERS

FIELD OF THE INVENTION

This invention relates to a measuring apparatus and, more particularly, to a measuring apparatus and a method for the adjustment of test/measurement parameters in an optical time domain reflectometer (OTDR) or an electrical time domain reflectometer (TDR).

BACKGROUND OF THE INVENTION

Test and measurement instruments commonly comprise several hard-keys (knobs, buttons etc. fixed to the housing) each correlated with one or a few functions to operate and adjust test and measurement parameters of the instrument. Alternatively, it is known to use soft-keys (images of knobs, buttons, etc.) which are shown on the display of the instrument and that are temporarily or fixed assigned to a function of the instrument.

Test and measurement instruments with many hard-keys look complicated and build a psychological barrier to use the it. When using soft-keys, display space for the keys is always needed, reducing the available display space to depict the waveform representative of measured data. In addition, the operation of a hand-held instrument with many hard or soft-keys is ergonomically difficult.

SUMMARY OF THE INVENTION

The present invention relates to an apparatus and a method at least for the adjustment of test/measurement parameters of measuring instruments, particularly hand-held instruments.

Basically, an apparatus for the measurement of optical and/or electrical signals, comprises:

a housing, a display to depict a waveform representative of said measured signals;

said display showing a menu and/or a submenu (FIGS. 4, 6) with one or more entries at least to adjust test/ measurement parameters (settings);

an electrical switch, particularly a single manually actuated keying device, such as a select-key, to pop-up said menu;

a pointing device moving a cursor to select an entry (settings etc.) in said menu;

said electrical switch activating a submenu being indicated by said entry;

said electrical switch deactivating said submenu correlated to said entry after adjustment of said parameters;

said electrical switch triggering a data processor (CPU) to restore the initial background contents (FIG. 2) to be seen prior to popping-up said menu.

The apparatus or instrument according to the invention needs only a few knobs or buttons for its operation. A run/stop button, a pointing device, and a button (select and/or confirmation key) to pop-up and -down a menu and/or one or more submenus for the adjustment of test/ measurement parameters and the adjustment of the display of the hand-held instrument. By pressing the select-key, a menu with icons, objects or text explanation pops-up on the display/screen of the instrument, particularly to adjust test/ measurement parameters prior to a measurement (settings), to adjust the form of representation of the measured signals (zoom) and the form of representation of the basic background contents of the display, such as the language of the entries in the windows of said display, the present time, date and the configuration of the instrument with regard to the particular operator. With the pointing device the operator selects a certain object or entry in the menu and activates an associated submenu by pressing the select-key. Then the operator selects a particular entry in the submenu, presses the select-key and either changes the measurement parameters by selecting a predetermined value or individually increases or decreases the value with the up or down function of the pointing device. After all test/measurement parameters have been adjusted by "walking" through the menu and submenus, the last shown menu or submenu is closed by the select-key and the data processor of the instrument deletes the menu or submenu and restores the initial background contents of the display which was to be seen prior to the time the menu has been popped-up by pressing the select-key for the first time.

According to one embodiment of the invention, the apparatus/instrument is an optical time domain reflectometer (OTDR) for the characterization/measurement of a fiber's attenuation, uniformity, splice loss, breaks, length etc.

According to another embodiment of the invention the described arrangement is used to operate an electrical time domain reflectometer (TDR) for the characterization/ measurement of an electrical cable, such as a coaxial transmission line, a communication line etc. or another lead, such as a pipeline.

In a further embodiment of the invention the described arrangement is used to operate an apparatus or a test set for the test/measurement of signals in wavelength division multiplexed systems (WDM-systems).

Particularly, the described apparatus/arrangement and method is advantageous when used for the operation of hand-held instruments, which have to be operated with a single hand; the left or right hand, depending on the operator. To increase the handiness of the instrument, the invention proposes to use an ergonomically designed housing, such as one with a gripping surface at least on its left-hand side and an appropriate design for the operation of the few buttons, knobs or switches already described.

According to a further embodiment of the invention, the pointing device is a function key block, particularly a cursor-key in the form of a cross-wise tiltable switch. Such cross-wise tiltable switch of the instrument comprises four separate arrows, showing up, down, left and right. When the field of the arrows is pressed by the operator, an electrical signal is generated, moving a highlighted cursor or a vertical line on the window of the display in the direction shown by the pressed arrow. If the operator presses the cursor-key according to the invention between two arrows, the cursor moves diagonal in the menu or in the submenu if appropriate.

According to another embodiment of the invention, the pointing device comprises four separate keys with different arrows in the mentioned directions. When these separate keys are pressed by the operator, cursor movement is the same as already described.

In another preferred embodiment of the invention, the menu and/or submenu is deactivated after a predetermined time interval, if the operation keys of the apparatus or instrument have not been actuated by the operator during the time interval. After that predetermined time interval, the data processor is triggered by a comparator to restore the initial background contents to be seen prior to popping-up the menu. The comparator in the apparatus or instrument compares the time interval since the last activation of the operation keys, particularly of the pointing device and/or of the electrical switch, such as the keying device, with a predetermined time interval.

According to a preferred embodiment of the invention, the menu is a rectangular window or area depicting several symbols, icons or text fields explaining the functions which can be selected by means of the cursor-key and the assigned submenu is activated by pressing the select-key.

In another embodiment of the invention, the display, such as a TFT or DSTN monochrome/color display, shows a first window, depicting the entire waveform representative of measured signals and a separate, second window, depicting a part of the entire waveform in greater detail.

The first window, showing the entire waveform, additionally may comprise an adjustable rectangle or another geometrical figure which can be moved along the entire waveform and surrounding a part of the entire waveform. The surrounded part is displayed in the second window in greater detail.

According to one embodiment of the invention, the rectangle is adjusted by pressing the select-key and the menu pops up. Then the operator activates the zoom function/object in the menu. After its activation the menu automatically pops-down and the operator adjusts the broads of the geometrical figure surrounding a part of the entire waveform by pressing the left or right arrow on the pointing device (smaller/larger). The adjustment of the heights of the surrounding geometrical figure is adjusted by pressing the up or down arrow on the pointing device (larger/smaller).

According to a preferred embodiment of the invention, the electrical switch to pop-up or pop-down the menu or a submenu is realized in the form of a single manually actuated keying device, particularly the already described select-key. When the keying device is pressed the first time it generates the actuating signal to pop-up the menu and generates a deactuating signal to pop-down the menu or a submenu, when pressed another time.

The several symbols, icons or text fields etc. (functions/objects) in the menu and the submenus are individually selectable by the pointing device. If selected, it is highlighted and the pressed select-key activates a submenu "behind" the highlighted function/object.

According to a preferred embodiment of the invention, the speed of movement of the cursor over the display or within the described windows increases if the pointing device is activated for longer than a predetermined time interval. A comparator compares the predetermined time interval with the time interval during which the pointing device is activated and if it is longer, the cursor is triggered to increase its speed of movement.

According to another preferred embodiment of the invention, different functions are assigned to the pointing device and/or to the keying device. This assignment may depend on the operation mode of the instrument and/or the currently displayed menu, submenu or window.

The present function or functions of the pointing and/or keying device is explained and depicted in a third window of said display by text, symbols or icons. It is preferred, to arrange the third window immediately adjacent to the pointing and/or keying device.

In another embodiment of the invention the instrument comprising a pointing device and a keying device, additionally comprises a start(stop device to start/stop the measurement and a help-key to activate a context sensitive help system, explaining the options the operator has and explaining what is to be done to adjust the test measurement and display parameters. A window with information is overlaid upon the current display or screen.

A preferred method for the adjustment of test/measurement parameters or more generally the operation parameters of an instrument, particularly of a hand-held instrument, comprises a first step in which a display of the instrument, such as an optical time domain reflectometer (OTDR) or an electrical time domain reflectometer (TDR) depicts a waveform representative of the measured signals In a second step an electrical switch is activated, particularly a manually activated keying device being pressed by an operator and a menu at least for adjusting test/measurement parameters pops-up on said display. The manual activated keying device is a select and/or confirmation key. In a third step an entry in the menu is selected by a pointing device, such as a manually actuated cursor-key, moving a cursor and in a fourth step an electrical switch activates a submenu which is indicated by said entry. After adjustment of the parameters the electrical switch is pressed by the operator deactivating the submenu correlated to the entry in the fifth step. In a sixth step the electrical switch triggers a data processor to restore the initial background contents to be seen prior to popping-up said menu.

Advantageously, the adjustment of the operation parameters can be performed easily by the menu and very few knobs or buttons. Additionally, the display of the instrument, which is of limited size, particularly in hand-held instruments, is completely available to depict the measurement results after adjusting the operation parameters.

In order to allow a quick adjustment, the invention proposes to use a pointing device generating a cursor moving over the display and the speed of movement of a cursor over the display (or one of the windows of the display) increases if the pointing device, such as the already described tiltable switch, is activated for longer than a predetermined time interval. Also, a vertical or horizontal line on the display may be moved accordingly.

It is understood and expressly noted that the present invention relates to all useful and novel combinations of the above disclosed features, whether alone or in any other or arbitrary combination. Furthermore, all cited advantages can also be seen as objects solved by the invention in its entirety.

BRIEF DESCRIPTION OF THE DRAWINGS

For better understanding of the present invention, together with other and further objects, advantages and capabilities thereof, reference is made to the accompanying drawings, which are incorporated herein by reference and in which:

FIG. 1 shows the top view of the right half of an OTDR according to the invention when the instrument is held in operator's hands. FIG. 1 depicts an OTDR 1 with a housing 2, a display 3, such as a TFT or DSTN monochrome or color display, a pointing device 4 to move a cursor (not shown) along the display 3 and a select-key 5, to pop-up a menu or a submenu, after an entry in the menu or another submenu has been selected by the pointing device.

Figure 1:
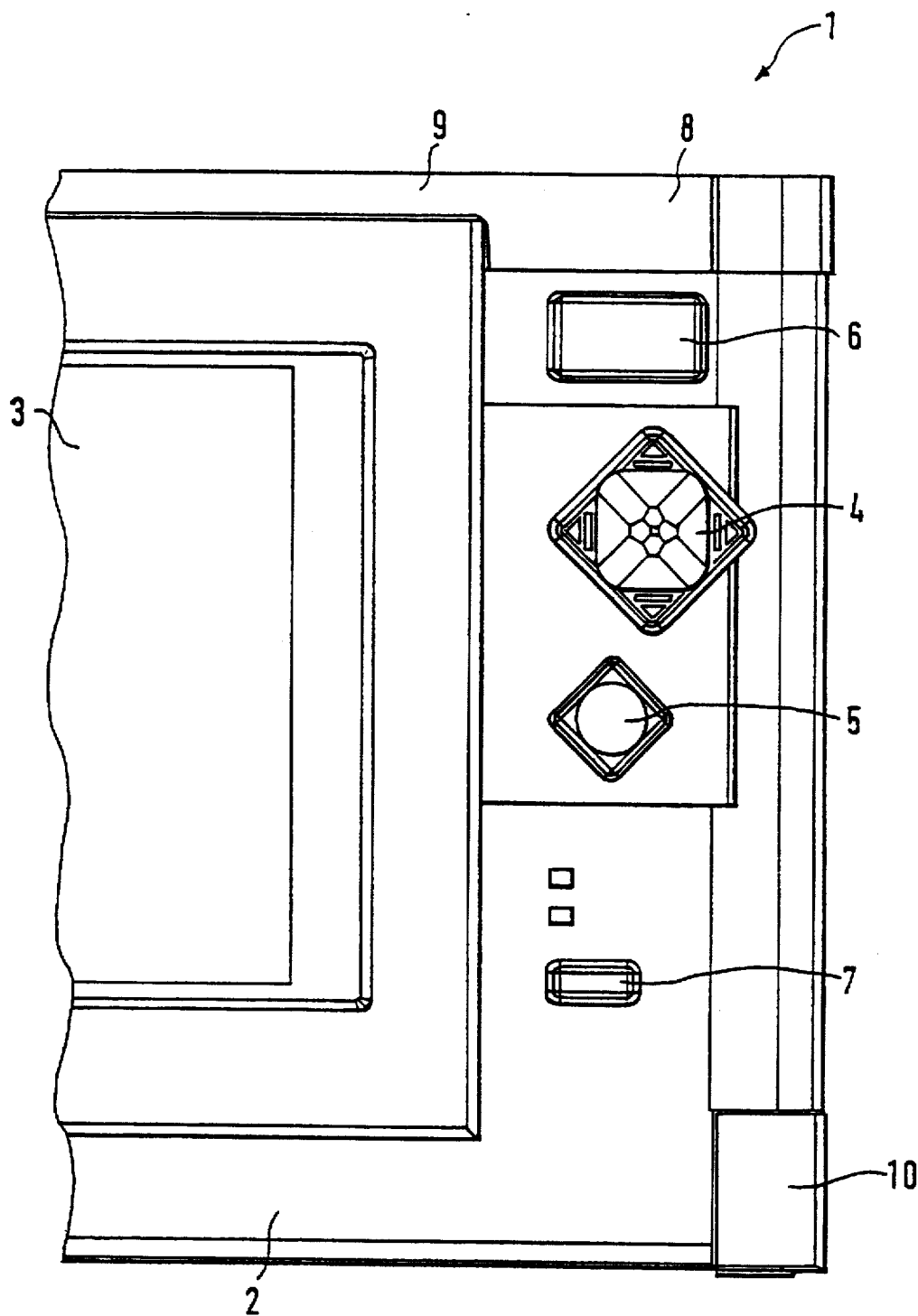
FIG. 1 is a schematical view of an optical time domain reflectometer (OTDR) according to the invention showing the right part of its housing, its display and its operation buttons.

In addition, the housing 2 of the OTDR 1 comprises a help-key 7 to activate a context sensitive help information depending on the activated menu, submenu or entry, such as by the aid of text explaining what should be done or explaining the meaning of an entry, icon or text field in a menu of the OTDR. The OTDR also comprises a parallel data port 8, a serial data port 9 and a battery compartment 10, to operate the OTDR without an external power source (not shown in detail).

As will be seen from FIG. 1, the OTDR according to the invention comprises only three buttons 4, 5, 6 (if one elects the help-key 7 and a power-on key, not shown) to operate the OTDR according to the invention.

FIG. 1 shows an arrangement of the operation buttons close to the display 3 on the right-hand side of the instrument. But it will be understood that the operation buttons also could be located on the left-hand side of the display 3.

The pointing device 4 (cursor-key), is a function key block in the form of a crosswise tiltable switch. The cursor-key comprises four arrows at its edges showing up, down, left and right. The center of the cursor-key is constituted by a recessed portion in comparison to the arrow segments.

The select-key 5 comprises a raised portion at its center. Accordingly, the operator can easily distinguish between cursor-key 4 and select-key 5, even if his working environment is dark, and can fully concentrate on a waveform representative of measured signals and shown on the display 3. According to the invention, it is proposed to locate the operation buttons or keys 4, 5, 6 and 7 immediately adjacent to the display 3.

Figure 2:
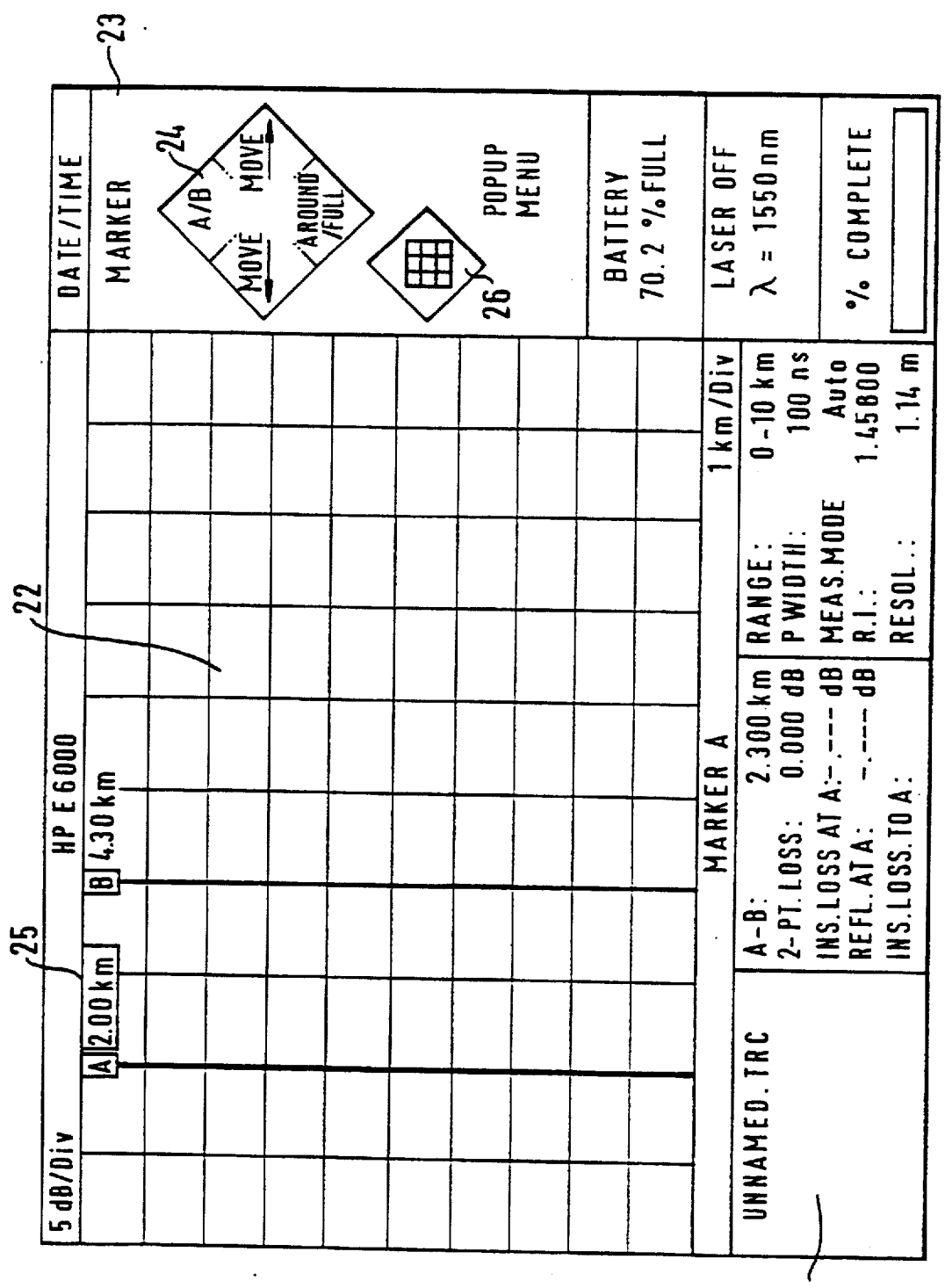
FIG. 2 shows the OTDR's display after booting into a basic operation mode and prior to a measurement or loading an already measured waveform.

FIG. 2 shows the OTDR's display 3 after switching power on and booting into a basic operation mode and prior to carrying out a measurement or loading a stored waveform into the display.

Among further windows, the display 3 shows a first window 21 to depict the entire waveform representative of measured signals, a separate window 22, to depict a part of the entire waveform in greater detail and a third window 23 depicting the current function or functions of the pointing device 4, illustrated by picture 24 of the cursor-key 4 and the picture 26 explaining the function of select-key 5. The arrow showing up on pointing device 4 switches from marker A (indicated by 25) to marker B when pressed; illustrated by symbol 24.

After carrying out a measurement or loading a formerly measured waveform representative of the measured signals, the entire waveform will be displayed in the first window 21 and a part of the entire waveform will be displayed in window 22 in greater detail. When the left arrow of pointing device 4 is pressed, a vertical line 27 can be moved to any location on the waveform. The measured data for the selected point of the fiber under test is displayed in a window 28 (data not to be seen in FIG. 2). N the arrow showing to the right is pressed, the vertical line 27 moves to the right. The same applies to marker B after pressing the up-arrow currently being assigned to switch over from vertical line A to vertical line B. When pressing the down-arrow on pointing device 4 either the full waveform ("full" function) is shown in window 22 of display 3 or the waveform around the highlighted marker A or B is shown in greater detail.

The entries in the other windows of the display 3 are self-explanatory for those skilled in the art and accordingly will not be described.

Figure 3:
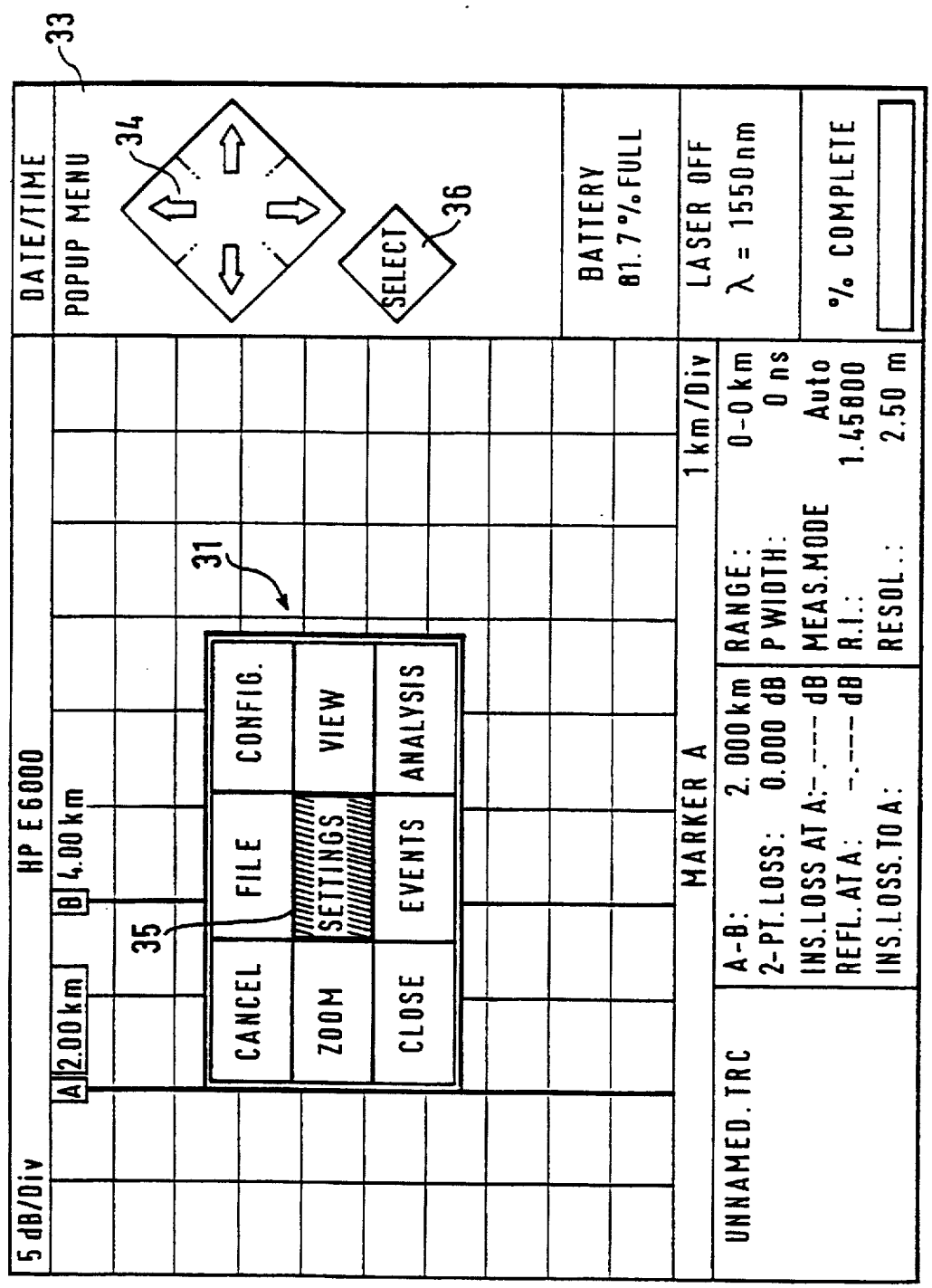
FIG. 3 shows the OTDR's display with a menu.

FIG. 3 shows the OTDR's screen after booting into the operation mode and prior to carrying out a measurement or loading a formerly measured waveform representative of already measured signals but after pressing select-key 5. Menu 31 pops-up on display 3. Simultaneously, third window 33 changes its appearance indicated by the designation "Popup Menu". With the up, down, left and right arrows on pointing device 4, shown by symbol 34, the operator can move within the text fields of the menu to highlight an entry, such as the submenu "Settings" 35. After pressing the select-key 5, whose current assigned function is to pop-up a submenu when pressed (indicated by the representation of select-key 5 with the symbol "Select" 36), the menu disappears from the screen and submenu "Measurement Settings", shown in FIG. 4, pops-up.

Figure 4:
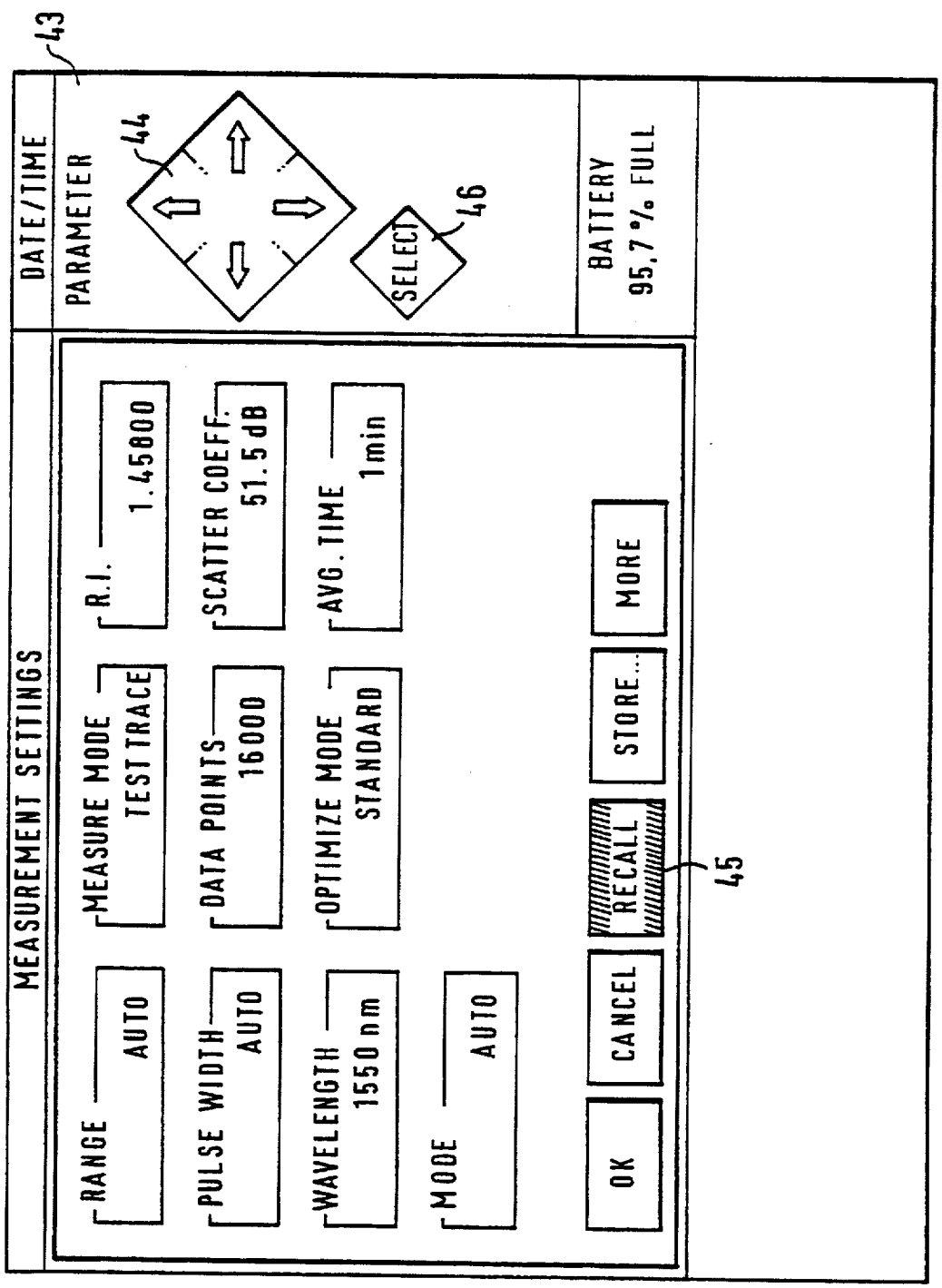
FIG. 4 depicts a submenu to adjust the measurement settings.

FIG. 4 shows the submenu "Measurement Settings". The third window 43 again changed its appearance to a "Parameter" window indicating the current functions of cursor-key 4 and select key 5 as shown by symbols 44 and 46. By the aid of cursor-key 4 the cursor 45 is moved to the different setting options, which will be highlighted. After pressing the select-key 5, a submenu (not shown) appears, either showing predetermined values which can be selected via cursor-key 4 and set with select-key 5 or the value may be stepwise raised or lowered by pressing the up- or down-arrow on cursor-key 4. The value increments or decrements accordingly. After adjusting the measurement settings, the adjusted parameters may be confirmed by the "OK"-software button or stored by the "Store..." button etc. If the operator wants to perform a measurement with the parameters just set, he will move the cursor to the OK-field and acknowledge the settings by select-key 5.

The submenu "Measurement Settings" pops-down and display 3 shows FIG. 2.

Figure 5:
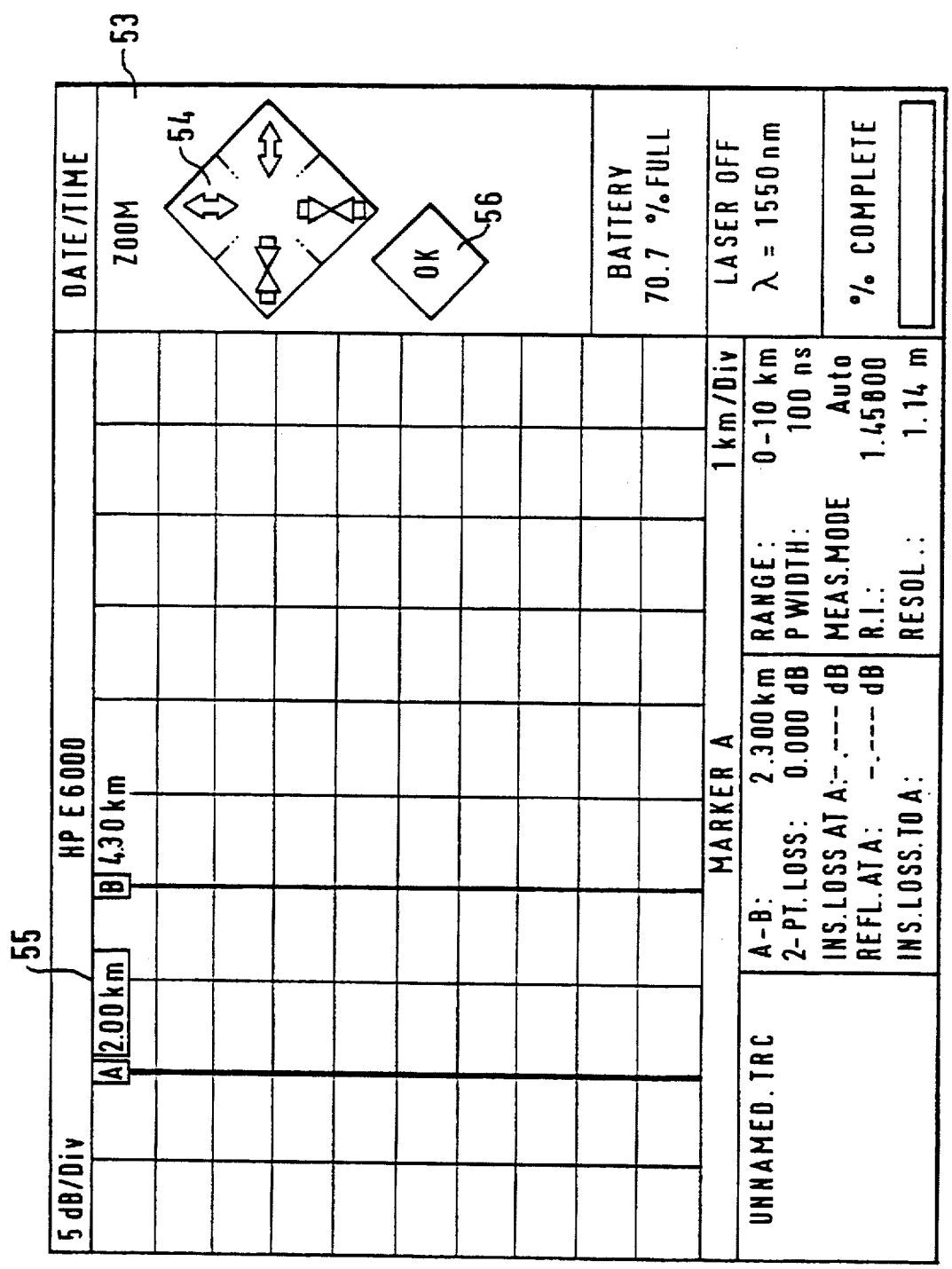
FIG. 5 depicts the OTDRs display after activating a zoom function in the menu.

FIG. 5 shows the appearance of display 3 after the zoom-submenu in menu 31 has been selected and the select-key 5 has been pressed. The third window 53 "Zoom" shows the functions which have been assigned to the cursor-key 4 and select-key 5, indicated by symbols 54 and 56.

After the measurement has been carried out by pressing run/stop button 6, the entire measured waveform will be displayed in the first window 21 and a part of the waveform is displayed in a second window 22 in greater detail (not shown). By the aid of cursor-key 4, an adjustable rectangle (not shown) is popped-up in the first window 51.

The adjustable rectangle or another geometrical figures surrounds a part of the entire waveform and its surrounded part is displayed in the second window 22 in greater detail (not shown). The size of the rectangle or of another figure is adjusted via the arrows on cursor-key 4.

Figure 6:
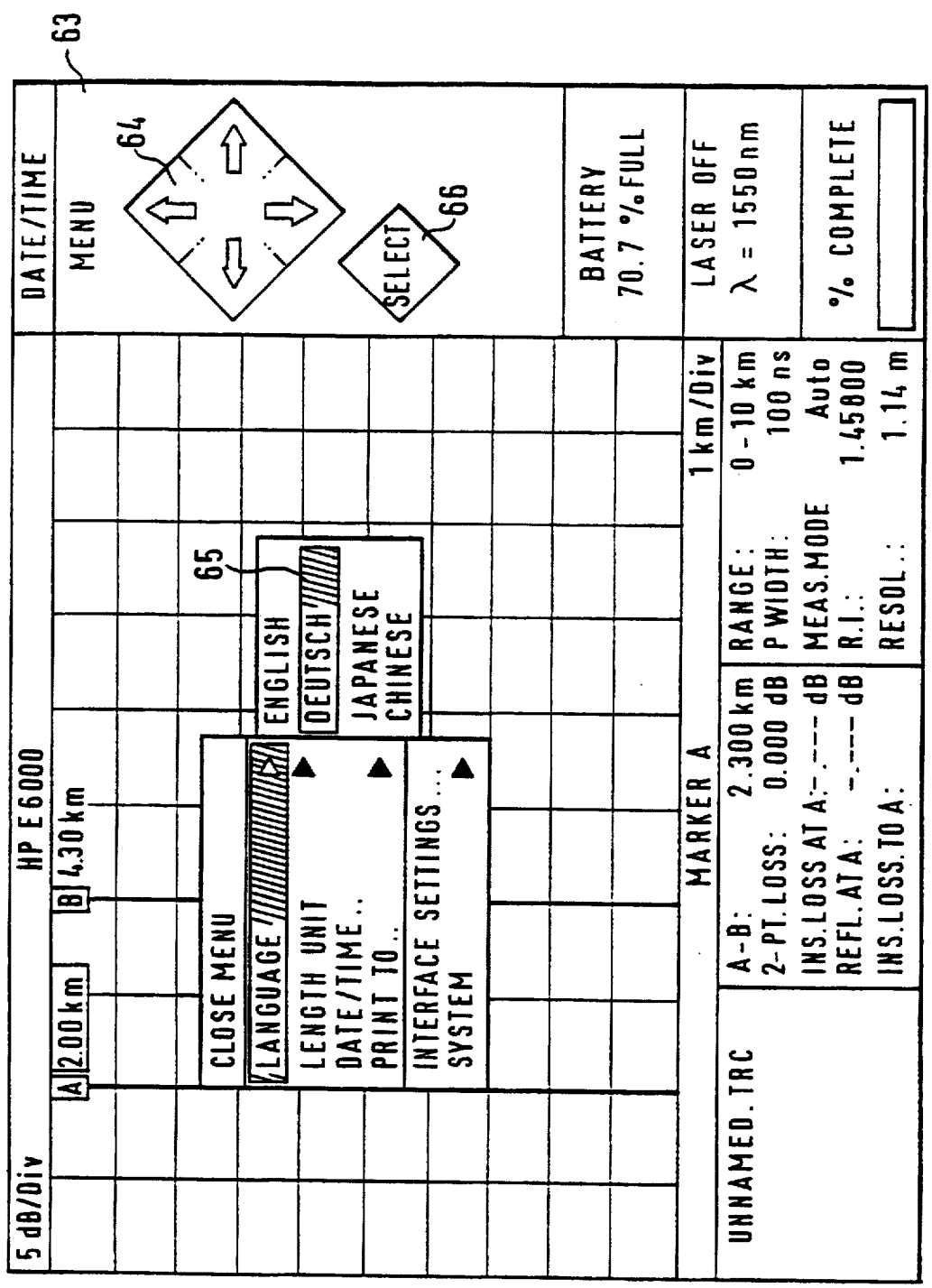
FIG. 6 shows a submenu to adjust the OTDR's configuration after activating the configuration function in the menu.

FIG. 6 shows the submenu behind the entry "Config." in menu 31. The entry to be modified can be accessed via cursor-key 4 and selected by select-key 5. The third window 63 "Menu" shows by aid of symbols 64 and 66, which functions have been assigned to cursor-key 4 and select-key 5. In the example in FIG. 6, the language of the entries in the display is changed from English to German (Deutsch) indicated by the highlighted entry 65. This modification of the configuration will take place after pressing select-key 5. The other entries in the configuration submenu are self-explanatory to those skilled in the art and thus will not be described.

It will be understood that the arrangement of the buttons can be used to operate any other instrument, particularly a hand-held instrument, very ergonomically.

Figure 7:
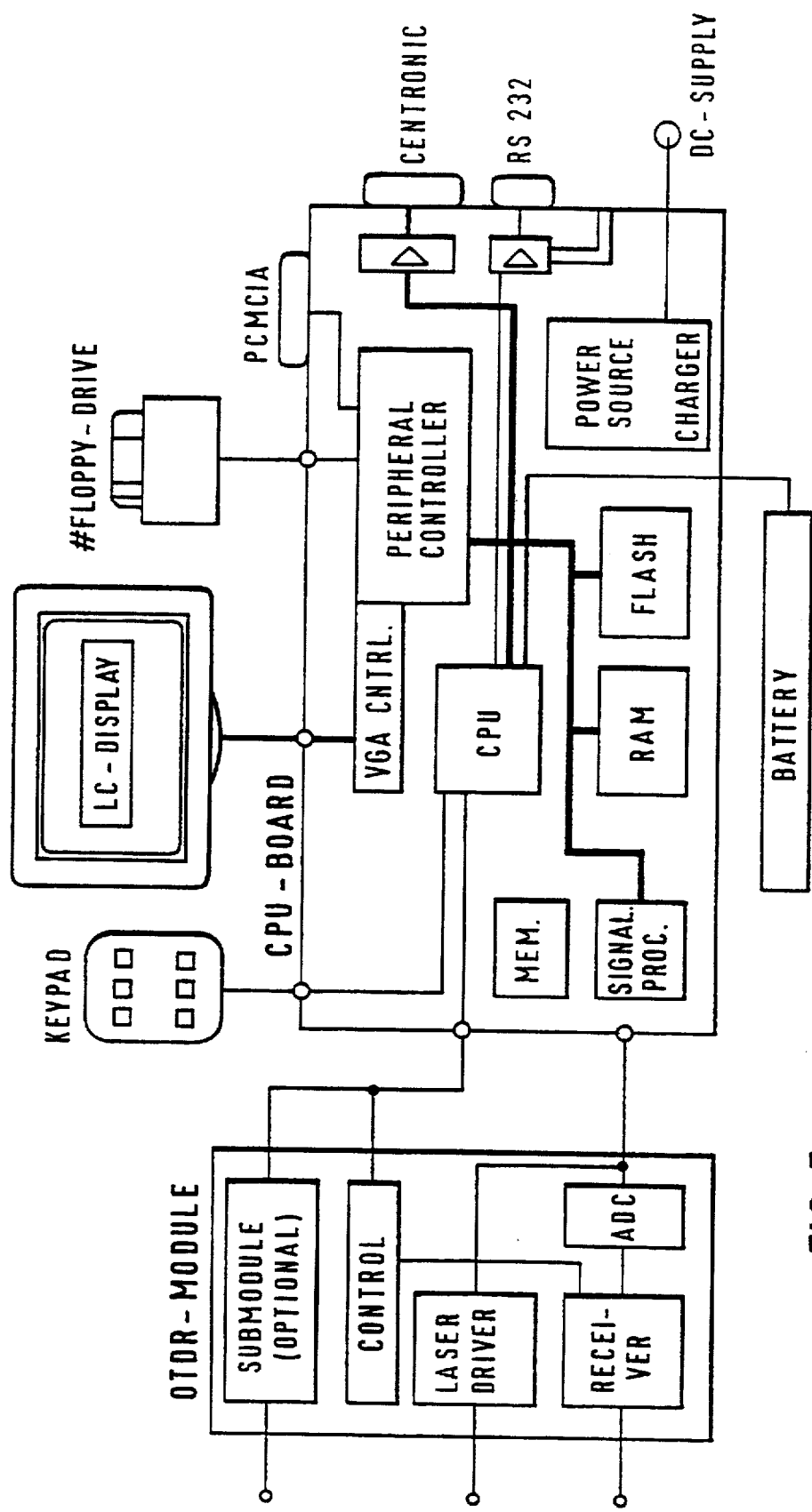
FIG. 7 is a schematical block diagram of the OTDR according to the invention.

FIG. 7 shows the OTDR 1 according to the invention by means of a schematical block diagram. OTDR 1 comprises a CPU-board, an OTDR-module, a keypad, such as shown in FIG. 1 and illustrated by cursor-key 4, select-key 5, start/stop-key 6 and help-key 7, a liquid crystal display (LC-display), a floppy drive and a battery.

The CPU-board is provided with a CPU, a peripheral controller, a VGA controller, a power source and charger for a battery, a RAM, a non-volatile flash memory, a signal processor and an associated memory.

The OTDR module comprises an optional submodule, such as a TDR-submodule for the characterization/ measurement of an electrical cable, such as an coaxial transmission line, a communication line etc. or another lead, such as a pipeline, a control to control the operation of the OTDR-module, a laser driver, a receiver and an analog/ digital converter.

After adjusting the measurement settings and activating start/stop button 6, the CPU (data processor) controls the control unit of the OTDR-module, controlling the operation of the laser driver and the receiver in the OTDR-module. The laser driver drives a laser diode launching optical pulses (10 m W or more) into a fiber under test. The pulse width ranges from nanoseconds to micrseconds at repetition rates of 1 kHz (for longer fiber lengths) up to 20 kHz (for short fiber lengths). Repetition rates are chosen such that the signals returning from the fiber do not overlap. The returning signal is separated from the launch signal for example by a directional coupler, is received by the receiver, the received analog measurement signal is converted by the analog/ digital converter and the digital representation of the measured signal is applied to the signal processor (another data processor), which is driven by the software in its associated memory. Measured signals are sent via a bus to the RAM, the flash-memory or to the peripheral controller after being processed by the signal processor. The peripheral controller communicates with VGA controller, signal processor, RAM and flash-memory. According to the invention, the peripheral controller is connected with the VGA controller driving the LC-display 3, a PCMCIA and the floppy-drive. The CPU is connected with a centronics port and a RS 232 port to exchange data with external computers, such as a PC.

The optional submodule in the OTDR-module may also be a visual light source for the visual recognition of fiber breaks. Furthermore, the optional submodule may be a power meter to measure the power of received signals or to check whether a 2 kHz-signal is received. In addition, the OTDR-module may comprise the laser source (not shown) which is operated by the laser driver.

Summarized, the invention proposes also a human interface for the operation of portable instruments, particularly OTDRs and electrical TDRs, which is easy to be used either by experts or low-skilled operators. Portable instruments with the human interface can be easily used in hand-held operation. How to be used is obvious and furthermore, the instrument is simple-looking so that low-skilled personnel will not have psychological barriers to use it, since the instrument comprises only a few keys. The human interface allows instrument adjustments with low and high complexity, is appropriate for the adaptation to several instrument-modes or applications and comprises intuitively input operations with a consistent operating principle. Use of graphical objects (icons, symbols etc.) and short-cuts is also possible. Display space is efficiently used for the display of the measured signals. A few keys (input devices) allow one-hand operation while carrying an instrument according to the invention. Input devices are low-cost and fast access to functions for time-efficient use is given.

We claim:

1. Apparatus for the measurement of optical and/or electrical signals, comprising:
   a housing;
   a display for depicting a waveform representative of measured signals, said display showing a menu and/or a submenu with one or more entries for at least enabling adjustment of test/measurement parameter settings;
   a manually actuated keying device for causing a pop-up said of said menu and/or submenu;
   a pointing device for moving a cursor to select an entry in said menu, said pointing device comprising a function key block in a form of a unitary crosswise tiltable switch, including four arrows showing up, down, left, right and for generating electrical signals to move a cursor in directions shown by said arrows or diagonal if actuated between two arrows;
   said keying device enabled to activate a submenu being indicated by said entry, and for deactivating said submenu correlated to said entry after adjustment of a parameter, said keying device triggering a data processor to restore initial background contents seen prior to popping-up said menu.

2. Apparatus according to claim 1, wherein said apparatus is an optical time domain reflectometer for characterization/ measurement of a fiber's attenuation, uniformity, splice loss, breaks, lengths etc. and particularly for hand-held operation.

3. Apparatus according to claim 1, wherein said apparatus is an electrical time domain reflectometer for characterization/measurement of an electrical cable and is further configured for hand-held operation.

4. Apparatus according to claim 1, wherein said apparatus is a wavelength division multiplexer (WDM) test set for characterization/measurement of signals in WDM-systems.

5. Apparatus according to claim 1, wherein different functions are assigned to said pointing device and/or said keying device, depending on an operation mode and/or on a menu, submenu or window.

6. Apparatus according to claim 5, wherein a current function or functions of said pointing and/or keying device are explained and depicted in a third window of said display by text or icons and wherein the third window is arranged immediately adjacent to said pointing and/or keying device.

7. Apparatus according to claim 1, wherein said menu and/or submenu is deactivated after a predetermined time by a comparator, comparing a time interval since a last activation of said pointing device and/or of said keying device, with a predetermined time interval.

8. Apparatus according to claim 1, wherein said menu includes entries depicting several symbols, icons or text fields etc. of functions/objects to adjust test/measurement parameters and/or the resolution of measured signals shown on said display.

9. Apparatus according to claim 1, wherein said display shows a first window, depicting an entire waveform representative of measured signals and a second window, depicting a part of the entire waveform in greater detail.

10. Apparatus according to claim 9, wherein said first window additionally shows an adjustable rectangle or another geometrical figure that is movable along the entire waveform, surrounding a part of the entire waveform and its surrounded part being displayed in said second window in greater detail.

11. Apparatus according to claim 10, wherein the size of said rectangle or said other figure is adjusted via accessing said menu, activating a zoom function/object in said menu, said menu automatically popping-down after activation of said zoom function/object, adjusting a width by pressing said left or right arrow and adjusting a height by pressing said up or down arrow on said pointing device.

12. Apparatus according to claim 1, wherein a speed of movement of said cursor within a first or further window of said display or within said main and/or submenu increases, if said pointing device is activated for longer than a predetermined time interval.

13. Apparatus according to claim 1, wherein said pointing device comprises four separate keys with different arrows showing up, down, left, right and each generating electrical signals to move said cursor in a direction shown on each separate key.

14. Apparatus according to claim 1, additionally comprising a start/stop device to start/stop said measurement and/or a help-key, for activating a context sensitive help system, overlaying upon a current screen of the display.

15. A method for the measurement of optical and/or electrical signals, comprising:

a first step in which a display of a hand-held instrument depicts a waveform representative of measured signals;

a second step in which a menu for enabling adjustment of test/measurement parameters pops-up on said display after activation of a manually activated keying device, said adjustment carried out by a pointing device moving a cursor over said display within one or more windows on said display and a speed of movement of said cursor increases if said pointing device is activated for longer than a predetermined time interval;

a third step in which an entry in said menu is selected by a pointing device moving a cursor;

a fourth step in which said keying device activates a submenu being indicated by said entry;

a fifth step in which said keying device deactivates said submenu correlated to said entry after adjustment of said parameters; and a sixth step in which said keying device triggers a data processor to restore initial background contents seen prior to popping-up said menu.

16. A hand-held apparatus for the measurement of optical and/or electrical signals, comprising:

a housing that is of a size which may be held by a single hand of a user;

a display in said housing for depicting a waveform representative of measured signals, said display showing a menu and/or a submenu with one or more entries for at least enabling adjustment of test/measurement parameter settings;

a manually actuated keying device positioned along one side of said housing, for causing a display of said menu and/or submenu;

a pointing device positioned along said one side of said housing, both said keying device and pointing device being sufficiently closely positioned along said one side so that both are operable by a single finger of a user's hand while said housing is held by said user's same hand, said pointing device for moving a cursor to select an entry in said menu; and said keying device enabled to activate or deactivate a procedure correlated to said entry after adjustment of a parameter.

17. Apparatus according to claim 16, wherein a speed of movement of said cursor within a first or further window of said display or within said main and/or submenu increases, if said pointing device is activated for longer than a predetermined time interval.

18. Apparatus according to claim 16, further comprising a start/stop device positioned along said one side of said housing and operable by said same one finger which is able to operate said keying device and pointing device while said housing is hand held, said start/stop device for starting or stopping said measurement.

19. Apparatus according to claim 16, wherein said apparatus is an optical time domain reflectometer for characterization/measurement of a fiber's attenuation, uniformity, splice loss, breaks, or length.

20. Apparatus according to claim 16, wherein said apparatus is an electrical time domain reflectometer for characterization/measurement of an electrical cable such as a coaxial transmission line, a communication line or another lead.

21. Apparatus according to claim 16, wherein said apparatus is a wavelength division multiplexer (WDM) test set for characterization/measurement of signals in WDM systems.

22. Apparatus according to claim 16, wherein said pointing device is a function key block in a form of a crosswise tiltable switch, comprising four arrows showing up, down, left, right and for generating electrical signals to move said cursor in directions shown by said arrows or diagonal if actuated between two arrows.

23. Apparatus according to claim 16, wherein said pointing device comprises four separate keys with different arrows showing up, down, left, right and each generating electrical signals to move said cursor in a direction shown on each separate key.

24. Apparatus according to claim 16, wherein said menu and/or submenu is deactivated after a predetermined time by a comparator, comparing a time interval since a last activation of said pointing device and/or of said keying device, with a predetermined time interval.

* * * * *